US007083825B2

(12) United States Patent
Carretti et al.

(10) Patent No.: US 7,083,825 B2
(45) **Date of Patent: *Aug. 1, 2006**

(54) COMPOSITION USED IN PRODUCING CALCIUM-RICH GETTER THIN FILM

(75) Inventors: Corrado Carretti, Milan (IT); Luca Toia, Carnago (IT)

(73) Assignee: SAES Getters S.p.A., Milan (IT)

( * ) Notice: Subject to any disclaimer, the term of this patent is extended or adjusted under 35 U.S.C. 154(b) by 228 days.

This patent is subject to a terminal disclaimer.

(21) Appl. No.: 10/820,571

(22) Filed: Apr. 8, 2004

(65) Prior Publication Data

US 2004/0195968 A1 Oct. 7, 2004

Related U.S. Application Data

(63) Continuation of application No. 10/282,715, filed on Oct. 29, 2002, now Pat. No. 6,793,461.

(30) Foreign Application Priority Data

Oct. 29, 2001 (IT) .................................... MI2001A2273

(51) Int. Cl.
*C23C 16/06* (2006.01)
*F04B 37/02* (2006.01)
*F04B 11/00* (2006.01)
*H01J 7/18* (2006.01)

(52) U.S. Cl. ............ 427/250; 427/255.11; 427/255.28; 427/255.395; 417/51; 417/48; 313/562; 252/181.1; 252/181.6; 252/181.7

(58) Field of Classification Search ............. 252/181.1, 252/181.2, 181.3, 181.4, 181.5, 181.6, 181.7; 417/48; 313/562, 556, 557, 558; 423/210; 445/4

See application file for complete search history.

(56) References Cited

U.S. PATENT DOCUMENTS

| | | | | | |
|---|---|---|---|---|---|
| 2,842,640 | A | * | 7/1958 | Ragan | 337/211 |
| 2,907,451 | A | * | 10/1959 | Della Porta | 417/48 |
| 3,033,354 | A | * | 5/1962 | Della Porta | 417/48 |
| 3,225,911 | A | * | 12/1965 | Della Porta | 417/48 |
| 3,275,433 | A | * | 9/1966 | Hilty et al. | 420/578 |
| 3,381,805 | A | * | 5/1968 | Della Porta et al. | 417/48 |
| 3,389,288 | A | * | 6/1968 | Della Porta et al. | 313/552 |
| 3,558,962 | A | * | 1/1971 | Reash | 313/549 |
| 3,669,567 | A | * | 6/1972 | Della porta et al. | 417/48 |
| 3,719,433 | A | * | 3/1973 | Rabusin | 417/48 |
| 3,734,714 | A | * | 5/1973 | Kozak et al. | 75/10.66 |
| 4,134,041 | A | * | 1/1979 | Della Porta et al. | 313/481 |
| 4,486,686 | A | * | 12/1984 | della Porta | 313/481 |
| 4,504,765 | A | * | 3/1985 | della Porta | 313/481 |
| 4,620,129 | A | * | 10/1986 | Luthra | 313/630 |
| 4,642,516 | A | * | 2/1987 | Ward et al. | 313/481 |

FOREIGN PATENT DOCUMENTS

| | | | | |
|---|---|---|---|---|
| JP | 05131134 | A | * | 5/1993 |
| WO | WO 01/01436 | A1 | * | 1/2001 |

OTHER PUBLICATIONS

Tumbull, J.C., "Barium, strontium, and calcium as getters in electron tubes," J. Vac. Sci. Technology, vol. 14, No. 1, Jan./Feb. 1977, pp. 636–639.

*Primary Examiner*—Joseph D. Anthony
(74) *Attorney, Agent, or Firm*—Perkins Coie LLP; Paul L. Hickman

(57) ABSTRACT

An improved getter device and method for forming a calcium-rich getter thin film in an electronic vacuum device is disclosed. The getter device includes a powder of a Ca—Ba—Al ternary alloy composed of between 53% and 56.8% by weight of aluminum, from 36% to 41.7% by weight of calcium and from 1.5% to 11% by weight of barium. The method allows the formation of a calcium-rich getter thin film with a substantially reduced amount of released hydrogen in the vacuum device.

15 Claims, 2 Drawing Sheets

U.S. PATENT DOCUMENTS 4,665,343 A * 5/1987 Ferrario et al. ............. 313/553
4,961,040 A * 10/1990 della Porta et al. ......... 313/561
5,118,988 A * 6/1992 della Porta ................. 313/561
5,312,606 A * 5/1994 Boffito et al. ............... 423/210
5,312,607 A * 5/1994 Schiabel et al. ............ 423/210
5,314,364 A * 5/1994 Snijkers et al. ............... 445/51
6,200,494 B1 * 3/2001 Manini et al. ........... 252/181.7
6,583,559 B1 * 6/2003 Carretti et al. .............. 313/553

* cited by examiner

COMPOSITION USED IN PRODUCING CALCIUM-RICH GETTER THIN FILM

REFERENCE TO PRIORITY DOCUMENTS

This application is a continuation and claims priority under 35 U.S.C. §120 to U.S. application Ser. No. 10/282,715 filed Oct. 29, 2002, now U.S. Pat. No. 6,793,461, which claims priority under 35 U.S.C. §119 to Italian Patent Application MI2001A 002273 filed Oct. 29, 2001, both which are hereby incorporated by reference for all purposes.

FIELD OF THE INVENTION

The present invention relates to a device and method for forming a calcium-rich getter thin film in an electronic vacuum device.

BACKGROUND

A number of industrial applications require a suitable vacuum to be kept in a sealed space for a period of several years. In particular, electronic vacuum devices such as CRTs (Cathode Ray Tubes), which are used as screens of television sets or computers, have this requirement. In CRTs, vacuum is required to avoid electrons emitted by a cathode from being deflected by collisions with gas particles. CRTs are evacuated during the manufacturing step through mechanical pumps and then hermetically sealed.

The vacuum in the tube tends however to decrease during time, mainly because of the degassing from internal components of the tube. It is therefore necessary to use inside the tube a getter material capable of capturing the gaseous molecules, thus preserving the vacuum degree necessary for the cathodic tube to work for the time needed. For this purpose barium is usually used in the form of a thin film deposited on inner walls of the cathodic tube. Because of the high reactivity of this metal, which would make every manufacturing operation troublesome, barium is used in the form of the air stable compound $BaAl_4$. To introduce the compound inside the cathodic tube there are utilized the so-called "evaporable getter" devices, formed of an open metallic container, inside which there is a compressed mixture of $BaAl_4$ and nickel powders (in a weight ratio of about 1:1); devices of this type are disclosed for example in patents U.S. Pat. Nos. 2,842,640, 2,907,451, 3,033,354, 3,225,911, 3,381,805, 3,719,433, 4,134,041, 4,486,686, 4,504,765, 4,642,516 and 4,961,040. These patents are incorporated herein by reference, in particular, for their teaching of methods of vaporizing $BaAl_4$ alloys within a sealed vacuum chamber, and various electronic devices employing such getters.

The $BaAl_4$ alloys are introduced inside the cathodic tube before sealing it, and then are heated from outside through radio frequencies to cause the evaporation of barium, which then condenses on the internal walls thus forming the film active in sorbing gases. Nickel has the function of reducing the energy required at radio-frequency heating: when the temperature of the mixture reaches about 850° C., the following exothermal reaction takes place: $BaAl_4+4\,Ni \rightarrow Ba+4\,NiAl$. The heat generated by this reaction raises the temperature of the system up to about 1200° C., necessary to have barium evaporation; these devices are defined "exothermal" in the field.

The use of barium, however, has some drawbacks. First of all, like all heavy metals, it is a toxic material, so that the more barium material used, the more precautions that must be taken in manufacture, and also the greater the problems associated with disposing of the device to avoid environmental contamination. Furthermore, inside the cathodic tubes, barium is present also in areas hit by highly energetic electron beams used to generate the image inside the kinescope; in these conditions barium, and consequently the screen of the kinescope, emit X rays (even though in small quantities) that may be harmful to health.

In order to avoid the problems caused by the use of barium, co-owned PCT application WO 01/01436, discloses the use of calcium as a gas sorbing getter material, and the compound $CaAl_2$ as a precursor to be utilized for evaporating calcium. The compound $CaAl_2$ is preferably used in mixture with titanium powders.

The use of calcium-based evaporable getter material has also some advantages during the manufacture of CRTs, in that the evaporation of calcium is less violent and more easily controllable with respect to barium, even after the treatments at relatively high temperatures (about 450° C.) in oxidizing atmospheres which occur during some of the manufacturing steps of the tubes.

However, the calcium getter material disclosed in the above WO 01/01436 application has the problem that the $CaAl_2$ alloy accumulates a substantial amount of hydrogen during its manufacture. The hydrogen contained in the alloy is released during the evaporation of calcium, and can negatively interfere with the deposition process. Furthermore, it is known that hydrogen can react with carbon atoms on the surface of metallic films, forming low molecular weight alkanes, such as methane, which is reabsorbed only with difficulty and partially by the same film.

SUMMARY OF THE INVENTION

In one aspect, the invention includes an improved method for forming a calcium getter film in an electronic vacuum device that substantially reduces the amount of $H_2$ released during film formation. The method includes vaporizing a powder of a Ca—Ba—Al ternary alloy containing between 50% and 60% by weight of aluminum, between 30% and 45% by weight of calcium and between 1.5% and 15% by weight of barium, and more preferably between 53% and 56.8% by weight of aluminum, between 36% and 41.7% by weight of calcium and between 1.5% and 11% by weight of barium. One exemplary alloy contains between 2.5% and 5% by weight of barium.

The powder of the ternary alloy has a preferred granularity between 50 and 250 μm. The powder of the ternary alloy may be formulated or blended with a powder of nickel or titanium metal, forming a mixed-powder composition, at a weight ratio of metal to alloy powders of between 3:1 and 1:3. The metal and alloy powder composition may also contain up to 5% by weight of a metal nitride selected from the group consisting of iron nitride, germanium nitride and combinations of the two nitrides.

In another aspect, the invention includes a getter device comprising a container containing a powder of a ternary Ca—Ba—Al alloy containing between 50% and 60% by weight of aluminum, between 30% and 45% by weight of calcium and between 1.5% and 15% by weight of barium, and more preferably between 53% and 56.8% by weight of aluminum, between 36% and 41.7% by weight of calcium and between 1.5% and 11% by weight of barium. One exemplary alloy contains between 2.5% and 5% by weight of barium.

The powder of the ternary alloy has a granulometry between 50 and 250 μm. The getter device may further include a nickel or titanium metal powder, at a weight ratio of metal powder to alloy powders of between 3:1 and 1:3. The mixed metal and alloy powders may further include up to 5% by weight of a metal nitride selected from the group consisting of iron nitride, germanium nitride and combinations of the two nitrides.

In still another aspect, the invention includes (i) providing an electronic vacuum device having a sealed enclosure under vacuum and having an interior wall surface, and (ii) coating the wall surface with a thin film composed of between 70% and 97% by weight calcium and 3% and 30% by weight barium. The film in an exemplary device is composed of between 85% and 95% weight percent calcium and 5% and 15% weight percent barium.

These and other objects and features of the invention will be more fully apparent when the following detailed description of the invention is read in conjunction with the accompanying drawings.

DETAILED DESCRIPTION OF THE INVENTION

The inventors have found that by substituting in compound $CaAl_2$ a small fraction of calcium atoms with barium atoms it is possible to substantially eliminate the problem of the hydrogen released during the calcium evaporation step.

The alloys used in the present invention are ternary alloys Ca—Ba—Al with a content varying between 50% and 60% by weight of aluminum, between 30% and 45% by weight of calcium and between 1.5% and 15% by weight of barium, and more preferably 53% and 56.8% by weight of aluminum, between 36% and 41.7% by weight of calcium and between 1.5% and 11% by weight of barium.

Figure 1A:
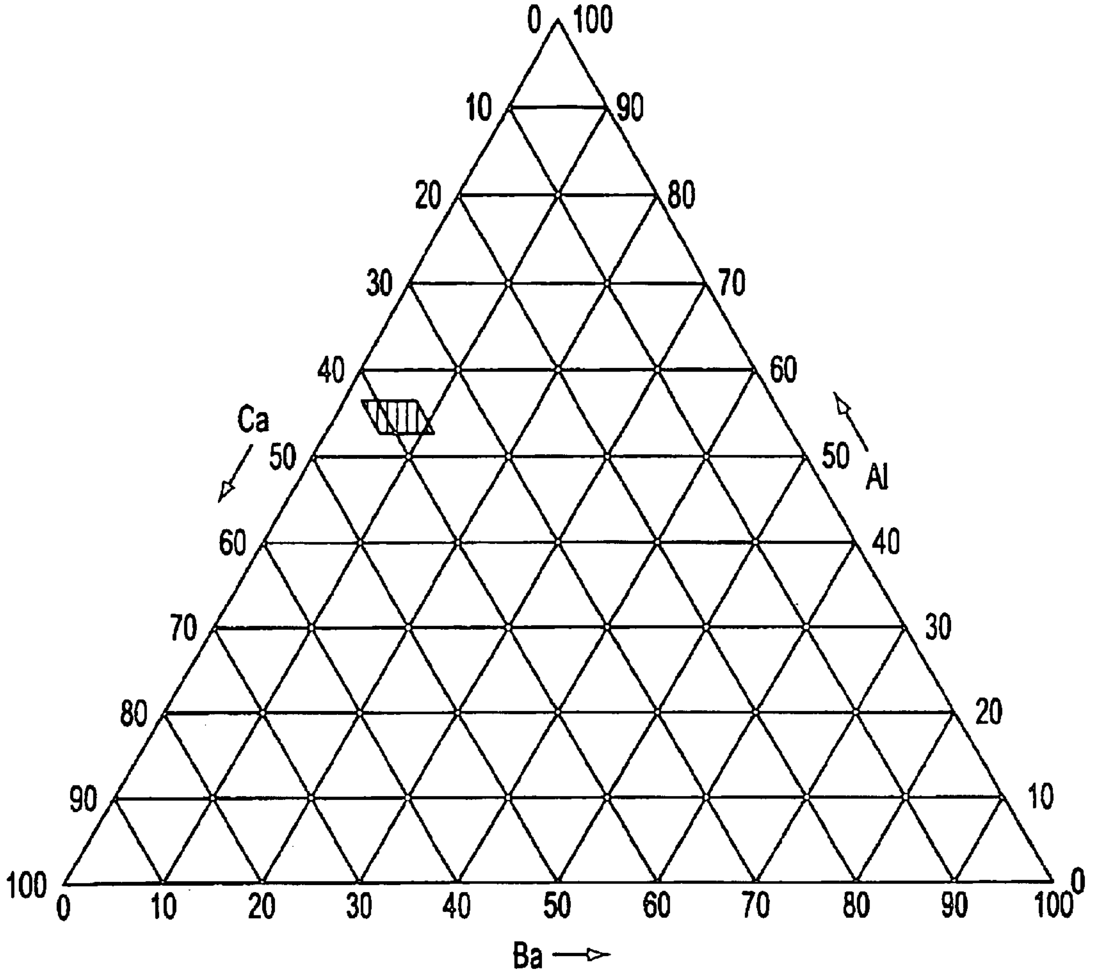
FIG. 1A shows a ternary diagram wherein the possible compositions of the alloys according to the present invention are illustrated.
Figure 1B:
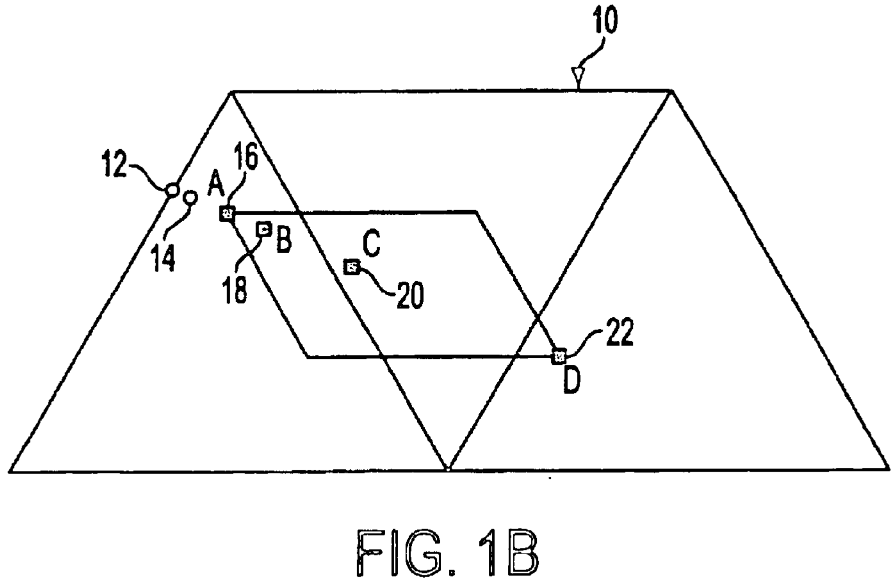
FIG. 1B shows the parallelogram in FIG. 1A in enlarged view.

These preferred compositions fall within the dashed area of the ternary diagram of FIG. 1A, this area having the form of a parallelogram shown in FIG. 1B, wherein some compositions produced and tested in the examples are also indicated. At barium weight percentages lower than 1.5%, there is no significant noteworthy reduction of the released hydrogen amount with respect to compound $CaAl_2$. At barium weight percentages higher than 11%, no further reduction in hydrogen emission is observed. Ca—Ba—Al alloys with a higher barium percentage could well be utilized, but they would have the drawback of increasing the amount of a potentially toxic element, not compensated by advantages regarding hydrogen emission. Within this range, alloys with a content of barium included between 2.5% and 5% by weight are used in a preferred embodiment of the invention.

With reference to compound $CaAl_2$, it is possible to produce alloys wherein as the barium percentage by weight increases, only the calcium percentage correspondingly decreases, while the aluminum percentage remains constant; preferably, however also, the aluminum content is decreased as the barium percentage increases.

The alloys of the invention are simply prepared by smelting the component metals in a stoichiometric ratio, and in particular ratios of $CaAl_2$ and $BaAl_4$, according to well-known methods. The melting can be carried out in a furnace of any type, for example an induction one, and preferably under an inert atmosphere such as argon.

In industrial applications, the alloys of the invention can be utilized in evaporable getter devices, formed of a container made up of metal, generally steel. The container is open on the upper part and has generally the shape of a short cylinder (in the case of the smaller devices) or of an annular channel with an essentially rectangular cross-section. The shape of the container can be essentially the same as the shape of containers utilized for analogous known devices, as referred to in multiple US patents mentioned in the background section. As defined herein, a getter device includes the container and the ternary alloy powder, and, optionally metal or nitride powders (see below), contained therein.

These devices can include the so-called "endothermic" type, wherein the whole heat necessary for the calcium evaporation is to be provided from outside, generally through induction heating; devices of this type contain only a compound of the invention. In a preferred embodiment, devices of "exothermic" type are used, as described previously with reference to devices for evaporating barium, containing, apart from an alloy of the invention, nickel, titanium or mixtures of powders of these two metals. In a preferred embodiment titanium is used.

Inside the getter devices the alloy Ca—Ba—Al is preferably used in the form of powders, generally with a granulometry lower than about 500 μm, preferably lower than 250 μm, and still most preferably between 45 and 150 μm.

In the case of exothermic devices, nickel or titanium is preferably utilized in the form of powders having a granulometry lower than about 100 μm and most preferably between 20 and 70 μm.

The weight ratio between the alloy Ca—Ba—Al and Ni or Ti in exothermic devices can vary within a wide range: this ratio is generally between about 1:3 and 3:1 and is approximately 1:1 in a preferred embodiment.

Also in the getter device of the present invention it is possible to include other components, preferably in powder form. For example, the device can contain percentages up to about 5% by weight (on the mixture of powders) of a compound chosen among iron nitride, germanium nitride or mixtures thereof. In these devices, nitrogen is released just before the evaporation of calcium, which allows one to obtain a more diffused metal film having a more homogeneous thickness. Examples of nitrogen-containing devices are reported in patents U.S. Pat. Nos. 3,389,288 and 3,669,567, which are incorporated herein by reference:

The free surface of the packet of powders in the container, both in the case of endothermic and exothermic devices, can have radial depressions (from 2 to 8, normally 4) to moderate the transfer of heat in the circular sense in the packet, thus reducing the problem of a possible expulsion of solid particles during calcium evaporation. For a more detailed explanation of this problem, and of the solution provided by the radial depressions, referred to patent U.S. Pat. No. 5,118,988, which is herein incorporated by reference.

Finally, in order to improve the homogeneity of the inductive heating of the packet of powders, it is possible to add in the packet a discontinuous metallic element, essentially parallel to the bottom of the container, as described in patent U.S. Pat. No. 3,558,962 and in European patent application EP-A-853328.

The invention will be further explained by the following examples. These non-limiting examples illustrate some embodiments aimed at teaching to those skilled in the art how to put the invention into practice and to represent the best regarded mode to realize the invention.

EXAMPLE 1 (COMPARATIVE)

100 g of compound $CaAl_2$ are prepared by smelting in a refractory crucible (made of mixed oxides of aluminum and magnesium) 42.6 g of calcium in the form of chips and 57.4 g of aluminum in the form of drops. In the portion of the ternary diagram 10 of FIG. 1B, this composition is represented by an empty circle 12. The melting is carried out in an induction furnace under argon. After the solidification of the melt product, the ingot is ground and the powders are sifted, recovering the fraction with granulometry included between 45 and 150μ;. 49.5 g of this powder are mixed with 50.5 g of titanium powder having a mean granulometry of 40 μm. With this mixture five devices for evaporating calcium are prepared, by using for each one a steel container shaped as an annular channel, with an outer diameter of 20 mm and channel width of 6 mm; each container is filled up with 1 g of mixture, compressing the powders with a shaped punch to which a pressure of about 6500 Kg/cm$^2$ is applied.

EXAMPLE 2 (COMPARATIVE)

Using the same procedure of example 1, 100 g of a ternary alloy with a per cent composition by weight Ca 42.3%-Ba 0.5%-Al 57.2% is used. This composition corresponds to an empty circle 14 in FIG. 1B. The ingot is ground recovering the fraction having a granulometry included between 45 and 150 μm; 45 g of powder so obtained are mixed with 55 g of titanium powder having a mean granulometry of 40 μm, and with this mixture five devices for evaporating calcium are prepared.

EXAMPLE 3

Five getter devices for evaporating calcium are manufactured following the procedure of example 2, by using, however, an alloy with a per cent composition by weight Ca 41.7%-Ba 1.5%-Al 56.8%. This composition corresponds to point A, represented with a filled square 16 in FIG 1B.

EXAMPLE 4

Five getter devices for evaporating calcium are manufactured following the procedure of example 2, by using, however, an alloy with a per cent composition by weight Ca 41.1%-Ba 2.5%-Al 56.4%. This composition corresponds to point B, with a filled square 18 in FIG. 1B.

EXAMPLE 5

Five getter devices for evaporating calcium are manufactured following the procedure of example 2, by using, however, an alloy with a per cent composition by weight Ca 39.5%-Ba 5%-Al 55.5%. This composition corresponds to point C, represented by a filled square 20 in FIG. 1B.

EXAMPLE 6

Five getter devices for evaporating calcium are manufactured following the procedure of example 2, by using, however, an alloy with a per cent composition by weight Ca 36%-Ba 11%-Al 53%. This composition corresponds to point D, represented with a filled square 22 in FIG. 1B.

EXAMPLE 7

The series of five evaporable getter devices produced in each of the examples from 1 to 6 (totally 30 devices) are subjected to evaporation tests. The samples are introduced one at a time in a glass flask with a volume of 6 liters, vacuum is made in the flask (with a pressure lower than $10^{-8}$ mbar) and the getter device is heated from outside by induction through radio-frequency. The flask is connected to a mass spectrometer, which records the development of the hydrogen pressure in the flask during time. This pressure has a maximum value corresponding to the evaporation and then decreases due to the reabsorption by the calcium film produced on the inner walls of the flask. According to a usual procedure in the field of evaporable getters, the evaluation of the hydrogen pressure is effected 15 minutes after the evaporation. It is made an average of the results from the five tests carried out for each composition. The average values so obtained are shown in the semilogarithmic graph of FIG. 2, wherein the common logarithm of the hydrogen pressure value (in mbar) 15 minutes after the evaporation is reported as a function of the percentage by weight of barium in the sample; the values corresponding to the comparative samples are represented with empty circles 12 and 14, and closed squares A, B, C and D as in FIG. 1A.

Figure 2:
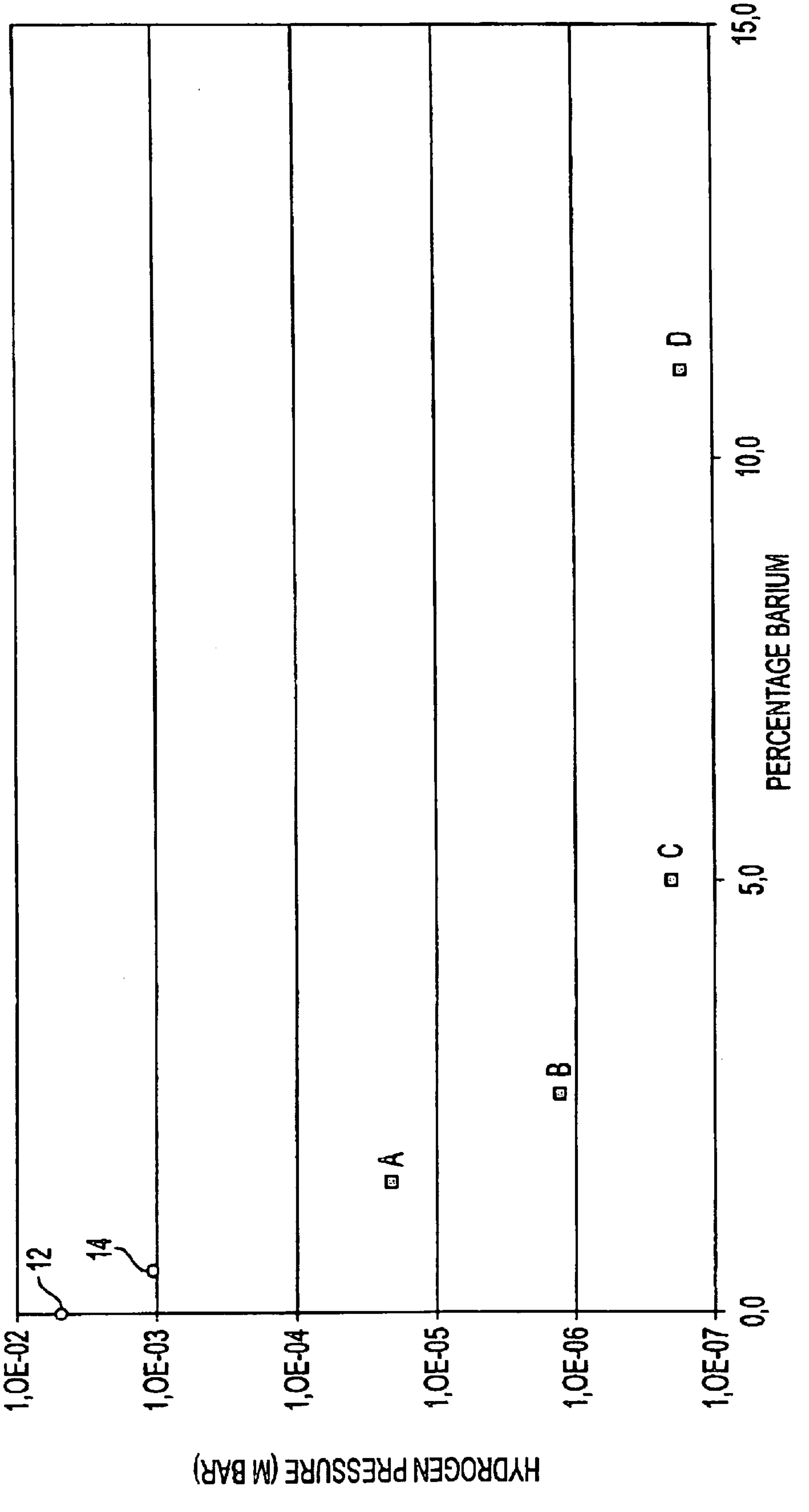
FIG. 2 shows the progress of the amount of hydrogen released by comparative devices and by the inventive devices as a function of the quantity of barium present in the alloy utilized in preparing the device.

As it is noted from the examination of FIG. 2, devices prepared with alloys of the invention present, shortly after the evaporation of calcium, a low hydrogen release of about $10^{-5}$ mbar or less, which is compatible with the expected applications in the manufacturing of CRTs for television sets and computer screens.

Although the invention has been described with respect to specific embodiments and applications, it will be appreciated that various changes and modifications may be made without departing from the invention.

It is claimed:

1. Vaporizing a powder of a Ca—Ba—Al ternary alloy composed of between 50% and 60% by weight of aluminum, between 30% and 45% by weight of calcium and between 1.5% and 15% by weight of barium within a sealed device under vacuum whereby the result is substantially reducing the amount of hydrogen released during a thin film coating process.

2. Ca—Ba—Al ternary alloys containing between 53% and 56.8% by weight of aluminum, between 36% and 41.7% by weight of calcium and between 1.5% and 11% by weight of barium.

3. The alloys according to claim 2, wherein the barium content is included between 2.5% and 5% by weight.

4. A getter for device evaporating calcium formed of a metallic container open at the upper part, wherein a packet of compressed powders of an alloy of claim 2, is present.

5. The getter device according to claim 4, wherein said powders have a granulometry lower than 500 μm.

6. The getter device according to claim 5, wherein said powders have a granulometry lower than 250 μm.

7. The getter device according to claim 5, wherein said powders have a granulometry included between 45 and 150 μm.

8. The getter device according to claim 4, wherein said packet of powders further contains powders of a metal chosen among nickel and titanium or a mixture thereof.

9. The getter device according to claim 8, wherein said metal powders have a granulometry lower than 100 μm.

10. The getter device according to claim 9, wherein said metal powders have a granulometry included between 20 and 70 μm.

11. The getter device according to claim 8, wherein the weight ratio between the Ca—Ba—Al alloy and the metal is included between 1:3 and 3:1.

12. The getter device according to claim 11, wherein said ratio is about 1:1.

13. The getter device according to claim 4, further containing a compound chosen among iron nitride, germanium nitride or mixtures thereof in a quantity up to 5% with respect to the total weight of the powders.

14. The getter device according to claim 4, wherein said packet of powders has a free surface having from two to eight radial depressions.

15. The getter device according to claim 4, wherein in said packet of powders there is a discontinuous metallic element, essentially parallel to the bottom of the container.

* * * * *